(12) United States Patent
Sorst et al.

(10) Patent No.: US 7,764,117 B2
(45) Date of Patent: Jul. 27, 2010

(54) METHOD AND SYSTEM FOR REDUCING A DYNAMIC OFFSET DURING THE PROCESSING OF ASYMMETRIC SIGNAL STRINGS

(75) Inventors: Manfred Sorst, Radebeul (DE); Michael Gieseler, Dresden (DE)

(73) Assignee: Zentrum Mikroelektronik Dresden AG, Dresden (DE)

( * ) Notice: Subject to any disclaimer, the term of this patent is extended or adjusted under 35 U.S.C. 154(b) by 458 days.

(21) Appl. No.: 10/598,286

(22) PCT Filed: Feb. 17, 2005

(86) PCT No.: PCT/DE2005/000275

§ 371 (c)(1),
(2), (4) Date: Oct. 1, 2007

(87) PCT Pub. No.: WO2005/083884

PCT Pub. Date: Sep. 9, 2005

(65) Prior Publication Data

US 2009/0153238 A1    Jun. 18, 2009

(30) Foreign Application Priority Data

Feb. 23, 2004   (DE) ................. 10 2004 009 038

(51) Int. Cl.
*H04B 1/10* (2006.01)
(52) U.S. Cl. ..................... 327/559; 327/307
(58) Field of Classification Search ......... 327/551–559, 327/307
See application file for complete search history.

(56) References Cited

U.S. PATENT DOCUMENTS

| 5,473,278 | A | * | 12/1995 | Shibata | 327/552 |
|---|---|---|---|---|---|
| 5,748,681 | A | | 5/1998 | Comino et al. | 375/319 |
| 5,815,037 | A | * | 9/1998 | Tomasini et al. | 330/69 |
| 6,420,927 | B1 | * | 7/2002 | Tavares et al. | 327/554 |
| 6,995,606 | B2 | * | 2/2006 | Bilotti et al. | 327/553 |
| 7,015,747 | B2 | * | 3/2006 | Kim | 327/552 |
| 2001/0009495 | A1 | | 7/2001 | Nguyen | 361/103 |

* cited by examiner

*Primary Examiner*—Hai L Nguyen
(74) *Attorney, Agent, or Firm*—Heslin Rothenberg Farley & Mesiti P.C.; Victor A. Cardona

(57) ABSTRACT

A method and a system for reducing a dynamic offset during the processing of asymmetric signal strings includes reducing a dynamic offset which allows a reduction of any disturbing influence on subsequent process steps. In every no-pulse period a capacitor is discharged by an amount depending on the value of the amplitude of the voltage of the high-pass structure on the input side.

4 Claims, 1 Drawing Sheet

Figure 1:
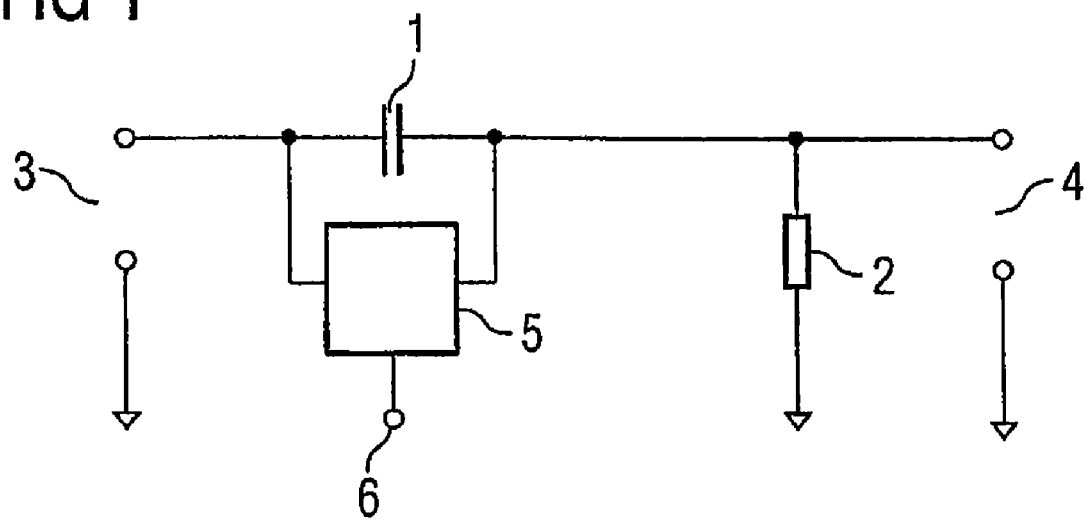

METHOD AND SYSTEM FOR REDUCING A DYNAMIC OFFSET DURING THE PROCESSING OF ASYMMETRIC SIGNAL STRINGS

Cross Reference to Related Applications

This application is a National Stage of International Application No. PCT/DE2005/000275filed on Feb. 17, 2005, and published in German as International Publication WO 2005/083884 A2 on Sep. 9, 2005, and claims priority of German Application No DE 10 2004 009 038.6, filed Feb. 23, 2004, the disclosures of which are incorporated by reference in their entirety.

The invention relates to a method and a system for reducing a dynamic offset during the processing of asymmetric signal sequences, whereby a signal sequence composed of pulses and interpulse periods is subjected to high-pass filtering by means of a high pass containing a capacitor.

The invention further relates to a system for reducing a dynamic offset during the processing of asymmetric signal sequences by means of a high pass containing a capacitor.

Signal sequences composed of pulses and interpulse periods occur, for example, in the transmission of information in packet-oriented data transmission protocols, whereby a packet may be composed of one or more pulses which are subject to an asymmetric pulse distribution.

In the processing of asymmetric signal sequences by means of a system which implements a high-pass function, as the result of the high-pass character a rectified voltage on the output side, referred to below as dynamic offset, is generated.

A shift in the mean signal voltage in the positive or negative direction as the result of the transmission characteristics, for example, generally leads to generation of the dynamic offset.

This dynamic offset, as a result of the offset-related shift of the working point, may have an interfering influence on the functioning of the system downstream from the system which implements the high-pass function. This influence appears in particular when the speed of the asymmetric signal sequence used for a data transmission does not permit the dynamic offset to be reduced by means of at least one self-return process specified by the high-pass system itself, using a time constant which depends on the dimensioning.

The object of the invention, therefore, is to reduce the dynamic offset in order to decrease the interfering influence on subsequent process steps.

The object is achieved by the method by the fact that in each interpulse period the capacitor is discharged by an amount which depends on the value of the amplitude of the input-side voltage of the high pass.

In the processing of asymmetric signal sequences by use of a system having a high-pass character, undesired integration of the voltage pulse sequences occurs at the high-pass output, resulting in generation of the dynamic offset. To avoid this offset, according to the invention a counter-control is applied to this integration process. To this end, the high-pass capacitor contained in the system having high-pass character is at least partially discharged in each interpulse period. The intensity of the discharge is determined, for example, by the amplitude of the input-side voltage.

In one embodiment of the invention, the capacitor is partially or completely discharged.

In a further embodiment of the invention, the discharge occurs according to a linear or nonlinear characteristic curve.

The high-pass capacitor may be discharged completely or only partially, depending on the requirements. The discharge process may be carried out according to a linear or nonlinear characteristic curve function. A discharge according to a nonlinear characteristic curve occurs, for example, in the case that the capacitor is bridged with the strip conductor of a transistor for reducing the offset.

The object is achieved by the system in that a first input is connected to a first connection for the capacitor and to a first connection for a controllable element, and that a second connection for the capacitor and a second connection for a controllable element are connected to a first output and to a first connection for an element implementing a resistance function. A second connection for the element implementing a resistance function, a second input, and a second output are connected to a reference potential. The controllable element has a third connection for supplying a control signal.

In a high-pass system comprising at least one capacitor and one element implementing a resistance function, the capacitor is bridged by two connections for a controllable element, the controllable element having a connection for supplying a control voltage. This control input may be used, for example, to switch an operating mode on or off for short-circuiting the capacitor electrodes. This operating mode may then, for example, be switched on for the entire duration of the interpulse period, or only for a specified time during the interpulse period. In addition, the discharge of the capacitor may be controlled, for example, as a function of the input voltage of the system according to a characteristic curve.

The respective second connections for the input, the output, and the element implementing a resistance function are connected to a reference potential, which may correspond to the ground potential or another voltage potential.

In one particular embodiment of the invention, the controllable element is a transistor.

An implementation variant for the controllable element is represented by the use of an FET transistor, the source-drain path of which bridges the capacitor, and the gate connection of which is actuated by a control signal.

In a further embodiment of the invention, the element implementing a resistance function is an ohmic resistor or a transistor.

The element implementing a resistance function may be implemented, for example, by use of an ohmic resistor. A further variant lies in the use of a bipolar or unipolar transistor for implementing the resistance function. This variant may be used, for example, when the high-pass time is to be controlled during continuous operation.

Figure 2:
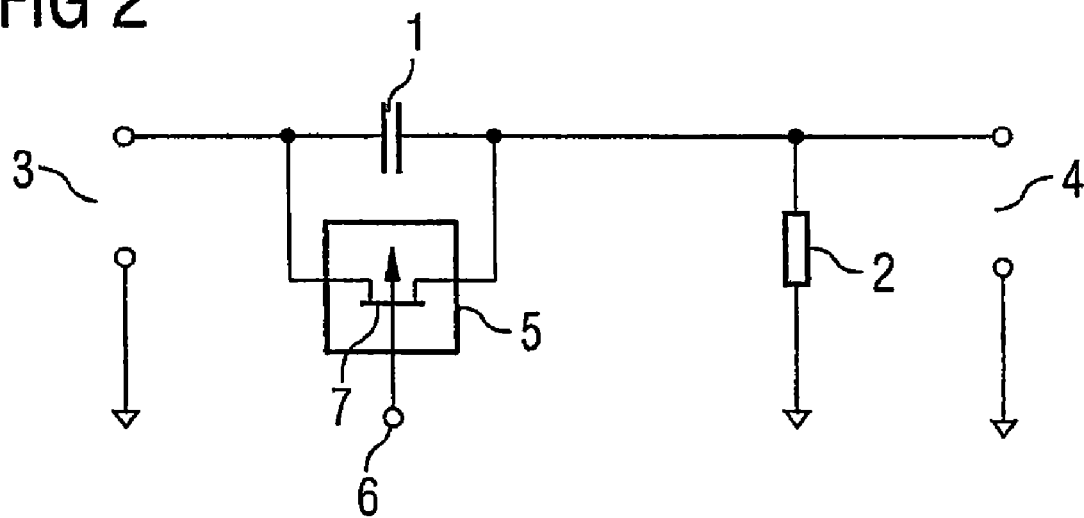

The invention is explained in greater detail below, with reference to one exemplary embodiment. The associated drawings show the following:

FIG. 1 shows a system for the implementing the method according to the invention; and FIG. 2 shows a system according to the invention in which a field-effect transistor is used as the controllable element.

FIG. 1 shows a system for implementing the method according to the invention. This system comprises a capacitor 1 which forms a high pass, as well as a resistor 2, for example. The high-pass system has an input 3 and an output 4, the first connections of which are each connected to the capacitor 1. The second connection for the input 3 and for the output 4 is respectively connected to a reference potential, which need not be the ground potential. According to the invention, the capacitor is bridged by two connections for the controllable element 5, which is connected via a control input to the control voltage 6 (not illustrated here in greater detail). Actuation of the controllable element causes it to become internally conductive between the connections which bridge the capacitor, and as a result of the discharge of the capacitor thereby reduces the dynamic offset. The control voltage thus ensures that the offset reduction occurs only in interpulse periods.

FIG. 2 shows a system according to the invention in which a field-effect transistor is used as the controllable element. In this example as well, the high pass is formed by the capacitor 1 and the resistor 2, which are connected in a customary manner to the input 3 and the output 4.

The controllable element 5 is designed as a field-effect transistor 7 which by means of its source-drain path bridges the capacitor 1.

This high-pass system is actuated by an asymmetric signal at the input 3.

It is assumed that the capacitor 1 is charged as a result of the position of the input signal for the duration of a pulse, and a charge transfer current flows through the capacitor. By use of this method, not only is the flank of the pulse transmitted to the output as desired, but also, as the result of charging the capacitor 1, under the assumption that the input resistance of a system connected to the output 4 allows or does not allow discharge of the output voltage in the time required therefor, an output-side dynamic offset is generated.

For a reduction of this offset according to the invention, a control voltage is applied to the gate connection of the field-effect transistor 7 via the control input 6. If this control voltage is in a region which results in generation of a gate-source voltage in relation to the working point impressed upon the input 3, which causes the source-drain path for the field-effect transistor 7 to become conductive, a discharging current which discharges the capacitor 1 begins to flow through the source-drain path. By changing the control voltage 6 and therefore the gate-source voltage, this discharging current may be controlled according to the characteristic curve for the field-effect transistor 7. Thus, both the intensity and the duration of the offset reduction may be controlled by means of the control voltage.

LIST OF REFERENCE NUMERALS

1 Capacitor
2 Element forming a resistance
3 Input
4 Output
5 Controllable element
6 Control input
7 Field-effect transistor

The invention claimed is:

1. A method for reducing a dynamic offset during the processing of asymmetric signal sequences, whereby a signal sequence comprising pulses and interpulse periods is subjected to high-pass filtering by means of a high pass containing a capacitor, wherein during each interpulse period the capacitor is discharged by a controllable element bridging the capacitor by an amount which depends on the value of the amplitude of the input-side voltage of the high pass.

2. The method according to claim 1, wherein the discharge occurs according to a linear or nonlinear characteristic curve.

3. The method according to claim 1, wherein the capacitor is partially or completely discharged.

4. The method according to claim 3, wherein the discharge occurs according to a linear or nonlinear characteristic curve.

* * * * *